(12) United States Patent
Park

(10) Patent No.: US 9,296,609 B2
(45) Date of Patent: Mar. 29, 2016

(54) OPTICAL-MICROWAVE-QUANTUM TRANSDUCER

(71) Applicant: Jae I. Park, Boulder, CO (US)

(72) Inventor: Jae I. Park, Boulder, CO (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 266 days.

(21) Appl. No.: 14/158,317

(22) Filed: Jan. 17, 2014

(65) Prior Publication Data

US 2015/0060650 A1     Mar. 5, 2015

Related U.S. Application Data

(63) Continuation-in-part of application No. 14/016,699, filed on Sep. 3, 2013.

(51) Int. Cl.
*H01J 3/14*          (2006.01)
*H01L 31/00*        (2006.01)
(Continued)

(52) U.S. Cl.
CPC ............... *B82Y 20/00* (2013.01); *B81B 3/0029* (2013.01)

(58) Field of Classification Search
CPC .. B81B 3/0029; B81B 3/0021; B81B 7/0093; B81B 2201/0292; B81B 2201/047; B82Y 20/00; G02B 6/00
USPC ............... 250/216, 221, 214.1; 977/700, 707, 977/712, 720–722, 724, 732, 755, 778, 784, 977/840, 855, 902, 932, 953, 954
See application file for complete search history.

(56) References Cited

U.S. PATENT DOCUMENTS

| 2006/0085160 A1 | 4/2006 | Ouchi |
| 2006/0209413 A1* | 9/2006 | Kim ....................... B82Y 20/00 359/577 |
| 2008/0267557 A1* | 10/2008 | Wang ..................... B82Y 20/00 385/16 |

FOREIGN PATENT DOCUMENTS

| EP | 1 213 774 B1 | 12/2010 |
| WO | WO 2009/023969 A1 | 2/2009 |
| WO | WO 2011/032825 A1 | 3/2011 |

OTHER PUBLICATIONS

Painter, "Optomechanical Crystals and Their Quantum Optical Applications", Photonics Conference (IPC), 2012 IEEE, Sep. 23, 2013, p. 546.

(Continued)

*Primary Examiner* — Pascal M Bui Pho
(74) *Attorney, Agent, or Firm* — Tarolli, Sundheim, Covell & Tummino LLP

(57) ABSTRACT

An optical-microwave-quantum transducer can include a first nanophotonic slab and a second nanophotonic slab. Each of the first and second nanophotonic slabs can include an optical region and a superconducting region. The first nanophotonic slab can include a pair of torsional beams anchored to a substrate to allow relative rotation between the first and second nanophotonic slabs about an axis of rotation. The optical-microwave-quantum transducer can include a gap between the optical region of the first and second nanophotonic slabs that forms an optical cavity in response to an optical signal, wherein the optical cavity can induce mechanical oscillation of the first nanophotonic slab about the axis of rotation. The mechanical oscillation can induce electrical modulation on a superconducting cavity coupled to the superconducting regions of the first and second nanophotonic slabs.

21 Claims, 4 Drawing Sheets

(51) Int. Cl.
B82Y 20/00 (2011.01)
B81B 3/00 (2006.01)

(56) References Cited

OTHER PUBLICATIONS

Mukhanov et al., "Development of Energy-Efficient Cryogenic Optical (ECO) Data Link", 2013 IEEE 14th International Superconductive Electronics Conference (ISEC), Jul. 7, 2013, pp. 1-3.
Cicak et al., "Vacuum-Gap Capacitors for Low-Loss Superconducting Resonant Circuits", IEEE Transactions on Applied Superconductivity, IEEE Service Center, Los Alamitos, CA, US, vol. 19, No. 3, Jun. 1, 2009, pp. 948-952.
Sun et al., "A Superhigh-Frequency Optoelectromechanical System Based on a Slotted Photonic Crystal Cavity", Applied Physics Letters, American Institute of Physics, US, vol. 101, No. 22, Nov. 26, 2012, pp. 221116-1-221116-5.
Winger et al., "A Chip-Scale Integrated Cavity-Electro-Optomechanics Platform", Optics Express, vol. 19, No. 25, Nov. 22, 2011, pp. 24905-24921.
International Search Report for PCT/US2014/052906, pp. 1-4.
Aoki, et al.: "*Observation of Strong Coupling Between One Atom and a Monolithic Microresonator*", Norman Bridge Laboratory of Physics 12-33, California Institute of Technology, Pasadena, CA 91125, USA, Sep. 4, 2006, pp. 1-12.
Dicarlo, et al.: "*Demonstration of Two-Qubit Algorithms with a Superconducting Quantum Processor*", Departments of Physics and Applied Physics, Yale University, New Haven, CT 06511, USA, May 1, 2009, pp. 1-6 & Supplemental Material pp. 1-3.
Eichenfield, et al.: "*Optomechanical Crystals*", California Institute of Technology, Pasadena, CA 91125, USA, Jun. 6, 2009, pp. 1-16.
Hossein-Zadeh, et al.: "*An Optomechanical Oscillator on a Silicon Chip*", IEEE Journal of Selected Topics in Quantum Electronics, vol. 16, No. 1, Jan./Feb. 2010, pp. 276-287.
Kimble: "*The Quantum Internet*", Norman Bridge Laboratory of Physics 12-33, Jun. 25, 2006, pp. 1-15.
Lin, et al.: "*Coherent Mixing of Mechanical Excitations in Nano-Optomechanical Structures*", Laboratory of Applied Physics, California Institute of Technology, Pasadena, CA 91125, USA, Aug. 7, 2009, pp. 1-27.
O'Connell, et al.: "*Quantum Ground State and Single-Phonon Control of a Mechanical Resonator*", Nature, Articles, vol. 464, Apr. 1, 2010, pp. 697-703.

Regal, et al.: "*From Cavity Electromechanics to Cavity Optomechanics*", 22$^{nd}$ International Conference on Atomic Physics, Journal of Physics: Conference Series 264 (2011) 012025, pp. 1-8.
Safavi-Naeini, et al.: "*Proposal for an Optomechanical Traveling Wave Phonon-Photon Translator*", New Journal of Physics 13 (2011) 013017 (30pp), Received Oct. 1, 2010, Published Jan. 13, 2011, Online at http://www.njp.org, pp. 1-30.
Sillanpää, et al.: "*Coherent Quantum State Storage and Transfer Between Two Phase Qubits Via a Resonant Cavity*", National Institute of Standards and Technology, 325 Broadway, Boulder, CO 80305, USA, Sep. 14, 2007, pp. 1-17.
Teufel, et al.: "*Circuit Cavity Electromechanics in the Strong-Coupling Regime*", Letter, Nature, vol. 471, Mar. 10, 2011, pp. 204-208.
Internation Search Report for corresponding PCT/US2014/065946 dated Mar. 25, 2015; Completed by Isabelle Porrachia.
Bochman, et al., "Nanomechanical Coupling between Microwave and Optical Photons", Nature Physics, vol. 9, No. 11, pp. 712-716 (2013), DOI: 10.1038/nphys2748.
Favero, et al., "Optomechanics of Deformable Optical Cavities", Nature Photonics, vol. 3, No. 4, pp. 201-205 (2009), DOI: 10.1038/nphoton.2009.42.
Teufel, et al., "Prospects for Cooling Nanomechanical Motion by Coupling to a Superconducting Microwave Resonator", New Journal of Physicans, vol. 10, No. 9, pp. 095002 (2008), DOI: 10.1088/1367-2630/10/9/095002.
Aspelmeyer, et al., "Cavity Optomechanics", Rev. Mod. Phys., vol. 86, No. 4, pp. 1391-1452 (2013), DOI: 10.113/RevModPhys.86.1391.
Tallur, et al., "Rayleigh Scattering Boosted Multi-GHz Displacement Sensitivity in Whispering Gallery Opto-Mechanical Resonators", Opt. Express 21, 27780-27788 (2013).
Tao, et al., "A Novel Transducer for Photon Energy Detection Via Near-Field Cavity Optomechanics", in *Solid-State Sensors, Actuators and Microsystems (Transducers & Eurosensors XXVII), 2013 Transducers & Eurosensors XXVII: The 17th International Conference on*, vol., No., pp. 1511-1514, 16-20 (2013) DOI: 10.1109/Transducers.2013.6627068.
Stannigel, et al., "Opto-Mechanical Transducers for Long-Distance Quantum Communication", Jun. 22, 2010, DOI: 10.1103/PhysRevLett.105.220501.
André, et al., "A Coherent All-Electrical Interface Between Polar Molecules and Mesoscopic Superconducting Resonators", Nature Physics, vol. 2, No. 9, pp. 636-642 (2006) DOI: 10.1038/nphys386.

\* cited by examiner

OPTICAL-MICROWAVE-QUANTUM TRANSDUCER

RELATED APPLICATIONS

The present application is a continuation-in-part of U.S. patent application Ser. No. 14/016,699, filed on 3 Sep. 2013, herein incorporated by reference in its entirety.

TECHNICAL FIELD

This disclosure relates to an optical-microwave-quantum transducer. More particularly, this disclosure relates to an optical-microwave-quantum transducer with a nanophotonic slab.

BACKGROUND

Nanophotonics (or Nano-optics) relates to the behavior of light on the nanometer scale. Nanophotonics is considered as a branch of optical engineering that relates to the interaction of light with particles or substances, at deeply subwavelength length scales. Technologies in the realm of nano-optics include near-field scanning optical microscopy (NSOM), photoassisted scanning tunnelling microscopy, and surface plasmon optics. As industrial communities become more interested in the characterization of materials and phenomena on the scale of a few nanometers, interest in nanophotonics continues to grow.

Superconducting microwave engineering relates to the behavior of electromagnetic excitations at or near GHz frequencies where the wavelength of light typically far exceeds the spatial scale of circuit components. The components of a superconductor circuit are made from superconducting materials and can be operated at near zero resistance. Superconducting engineering shares many similar features as microwave engineering.

Micro-mechanics and nano-mechanics relates to the study of mechanical resonators at the micrometer and nanometer scales. The primary interest is in operation when the mechanical mode frequency is much larger than the damping rate, e.g., a high quality factor. Such a study of mechanical resonators is leading to insights into quantum limited measurement and quantum dynamics at the mesoscale.

SUMMARY

One example relates to an optical-microwave-quantum transducer that can include a first nanophotonic slab and a second nanophotonic slab. Each of the first and second nanophotonic slabs can include an optical region and a superconducting region. The first nanophotonic slab can include a pair of torsional beams anchored to a substrate to facilitate relative rotation between the first and second nanophotonic slabs about an axis of rotation. The optical-microwave-quantum transducer can include a gap between the optical region of the first and second nanophotonic slabs that forms an optical cavity in response to an optical signal, wherein the optical cavity can induce mechanical oscillation of the first nanophotonic slab about the axis of rotation. The mechanical oscillation can induce electrical modulation on a superconducting cavity coupled to the superconducting regions of the first and second nanophotonic slabs.

Another example relates to an optical-microwave-quantum transducer that can include a nanophotonic slab that is electrically coupled to a superconducting cavity and that is optically coupled to an optical cavity. The nanophotonic slab can be configured to mechanically oscillate about an axis of rotation in response to either excitation in the optical cavity or electrical modulation in the superconducting cavity. The mechanical oscillation induced by excitation can induce electrical modulation in the superconducting cavity. The mechanical oscillation induced by electrical modulation can induce excitation in the optical cavity.

Yet another example relates to a system comprising a refrigeration unit that stores an optical-microwave-quantum transducer at superconducting temperatures. The optical-microwave-quantum transducer can include a nanophotonic slab that is electrically coupled to a superconducting cavity and that is optically coupled to an optical cavity. The nanophotonic slab can be configured to mechanically oscillate about an axis of rotation in response to either excitation in the optical cavity or electrical modulation in the superconducting cavity. The optical cavity can be optically coupled to an optical channel. The superconducting cavity can include a vacuum gap capacitor and an inductor that are spatially separated. A plate of the vacuum gap capacitor can be formed on the nanophotonic slab. The system also includes a node configured to transmit and receive optical signals on the optical channel comprising an optical fiber. The node can be external to the refrigeration unit.

DETAILED DESCRIPTION

An optical-microwave-quantum transducer can be configured to convert optical signals emitted from an optical channel into mechanical energy (e.g., oscillation about an axis). Moreover, such mechanical energy can cause the optical-microwave-quantum transducer to induce an electrical (quantum) modulation at a superconducting cavity (e.g., a superconducting circuit), thereby converting mechanical energy into electrical energy. In a similar manner, an electrical modulation at the superconducting cavity can be converted into mechanical energy at the optical-microwave-quantum transducer. In response, the optical-microwave-quantum transducer can induce optical signals onto the optical channel. In this manner, the superconducting cavity can be stored in a refrigeration unit and communicate via the optical channel with another node.

The optical-microwave-quantum transducer can include an optical cavity with a nanophotonic slab (e.g., a two dimensional nanophotonic crystal). The nanophotonic slab can include an optical region and a superconducting region that are separated by torsional beams anchored to a substrate. Excitation in the optical cavity or the superconducting cavity can cause the nanophotonic slab to rotate about an axis. The optical-microwave-quantum transducer can operate at a single-photon, fully reversible level.

Figure 1:
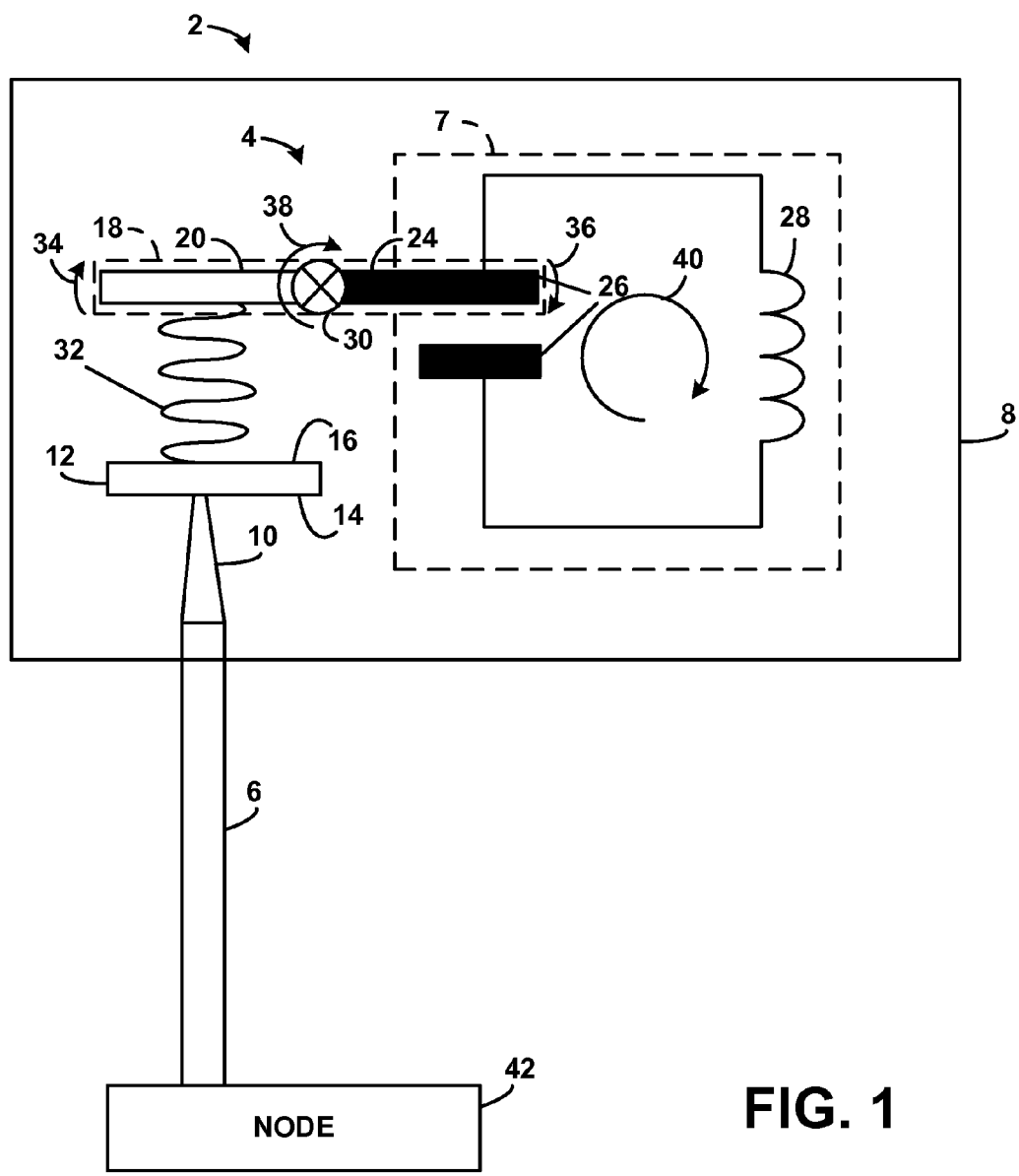
FIG. 1 illustrates an example of a system for transducing optical signals propagating along an optical channel into electrical signals propagated in a superconducting circuit and vice versa.

FIG. 1 illustrates an example of a transduction system 2 that includes an optical-microwave-quantum transducer 4 for transducing optical signals propagating along an optical channel 6 into electrical signals propagated in a superconducting cavity 7 (e.g., a superconducting circuit) and vice versa. The transduction system 2 can include a refrigeration unit 8 that can house circuit components therein. In some examples, the refrigeration unit 8 can reduce the temperature of the circuit components to a temperature below a critical temperature ($T_c$). The critical temperature for materials that form the circuit components is the temperature at or below which the circuit components achieve superconduction. In some examples, the critical temperature needed for superconduction can be a temperature of about 10 to about 30 milli-Kelvin (mK).

The optical channel 6 can be formed from an optical fiber. In some examples, the optical channel 6 can include an emission region 10 that can be coupled to a nanophotonic crystal 12, such as a nanophotonic slab. The emission region 10 could be implemented, for example, as a tapered optical region, a polished end of a cleaved optical fiber, etc. The nanophotonic crystal 12 can be a semi-transparent mirror. The nanophotonic crystal 12 can be formed, for example, with a material that has an index of refraction of about 2, such as silicon nitride ($Si_3N_4$). In one example, a lattice of holes can be drilled through the nanophotonic crystal 12. In such a situation, photons emitted from the emission region 10 of the optical channel 6 can be transmitted from a first side 14 of the nanophotonic crystal 12 to a second side 16 of the nanophotonic crystal 12. The nanophotonic crystal 12 can have an area of about 100 micrometers (μm) by 100 μm and each of the holes in the lattice of holes can have a radius of about 10 nanometers (nm) to about 20 nm. The nanophotonic crystal 12 can be positioned in parallel with a nanophotonic slab 18 (e.g., a two dimensional nanophotonic crystal). Moreover, it is to be understood that the nanophotonic crystal 12 can also be considered to be a nanophotonic slab 18. The nanophotonic slab 18 can be formed from the same material as the nanophotonic crystal 12.

The nanophotonic slab 18 can include an optical region 20 with another lattice of holes. In some examples, the lattice of holes in the nanophotonic crystal 12 and the nanophotonic slab 18 can have the same pattern. The lattice holes in the nanophotonic crystal 12 and the nanophotonic slab 18 can have a radius about 10 nm to about 20 nm. The nanophotonic slab 18 can also include a superconducting region 22 which can be coupled to the superconducting cavity 7. The superconducting cavity 7 can include a first plate of a capacitor 26 overlaying the superconducting region 22 of the nanophotonic slab 18. A second plate of the capacitor 26 can be spaced apart from the first plate by a distance of about 10-30 nm to form a vacuum gap capacitor. The capacitor 26 can be coupled in parallel to an inductor 28. The inductor 28 could be, for example, a center tapped, spiral inductor. The capacitor 26 and the inductor 28 can be a superconducting LC circuit that forms the superconducting cavity 7. The nanophotonic slab 18 can be anchored to a substrate with torsional beams 30 that are positioned between the optical and superconducting regions 20 and 22 of the nanophotonic slab 18. The torsional beams 30 can be formed as cantilevers that extend perpendicularly from a body of the nanophotonic slab.

In some examples the nanophotonic crystal 12 and the second plate of the capacitor 26 can be etched on the substrate. In other examples, the nanophotonic crystal 12 and the second plate can be etched on a common nanophotonic slab that overlays the substrate or is integrated with the substrate.

Photons transmitted from the nanophotonic crystal 12 to the nanophotonic slab 18 can be trapped between the nanophotonic crystal 12 and the nanophotonic slab 18 to form an optical cavity 32. Excitation in the optical cavity 32 can induce a torque on the nanophotonic slab 18 via optical pressure, which can cause the optical region 20 of the nanophotonic slab 18 to rotate in a direction indicated by the arrow 34, thereby causing mechanical oscillation of the nanophotonic slab 18. Correspondingly, the superconducting region 22 of the nanophotonic slab 18 can rotate in a direction indicated by the arrow 36 such that there is relative movement (e.g., relative rotation about at the torsional beams 30, as indicated by the arrow 38) between the first and second plates of the capacitor 26. Such relative movement (e.g., oscillation) can induce electrical modulation on the superconducting cavity 7, such as induction of a current on the capacitor 26 and the inductor 28 (indicated by the arrow 40), thereby converting mechanical energy into electrical energy.

In reverse, electrical modulation (e.g., a current) can be induced by the superconducting LC circuit (e.g., the superconducting cavity 7). The electrical modulation can induce a mechanical force on the superconducting region 22 of the nanophotonic slab 18, which can cause the nanophotonic slab 18 to oscillate. Oscillation of the nanophotonic slab 18 can induce photons (e.g., excitation) in the optical cavity 32 that are transmitted from the optical region 20 of the nanophotonic slab 18 to the second side 14 of the nanophotonic crystal 12. The induced photons can be transmitted from the second side 14 of the nanophotonic crystal 12 onto the optical channel 6.

In some examples, the transduction system 2 allows quantum state transfer. Specifically, the transduction system 2 allows for mapping of the quantum state in the optical mode at the optical channel 6 on to the electrical mode at the superconducting LC circuit or vice versa. Such a quantum state transfer allows for communication between the two different modes. Additionally or alternatively, the transduction system 2 allows iterate photon transfer, which provides for scattering in the optical mode to be mirrored in the electrical mode, or vice versa.

The optical channel 6 can be coupled to a node 42. The node 42 can include an optical input/output (I/O) port. In some examples, the node 42 can be another transduction system 2 with a superconducting cavity 7 (e.g., another superconducting LC circuit). In this manner, the superconducting cavity 7 of the node 42 can communicate over a distance (e.g., up to 10 kilometers or more) separated by the optical channel 6 with the superconducting cavity 7 of the transduction system 2. Alternatively, the node 42 could be implemented, for example, as a computer. In this situation, the node 42 could optically send control signals to the superconducting cavity 7 via the transduction system 2.

Since the nanophotonic slab 18 is only anchored at two points (the torsional beams 30), the transduction system 2 achieves a low clamping loss. Moreover, the capacitor 26 can be implemented as a parallel plate capacitor (e.g., a vacuum gap capacitor) that can have a relatively large participation ratio between the capacitor 26 and the inductor 28 of the superconducting LC circuit that forms the superconducting cavity 7.

The components of the optical-microwave quantum transducer 4 can be fabricated on a common integrated circuit (IC) chip. That is, both optical components and electrical components can be integrated on the same IC chip. Moreover, such an IC chip can be fabricated by employing modern fabrication techniques and without the need for external alignment.

Figure 2:
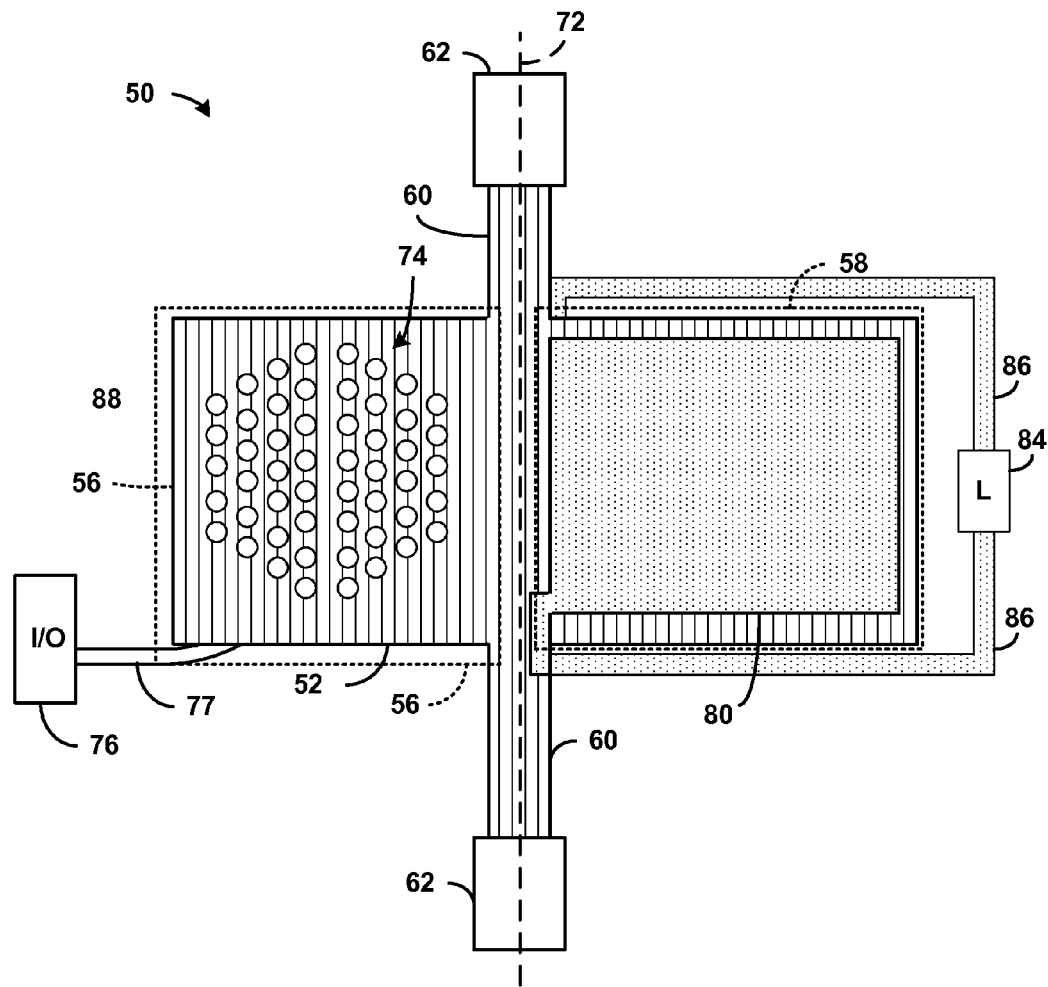
FIG. 2 illustrates an example of an optical-microwave-quantum transducer.
Figure 3:
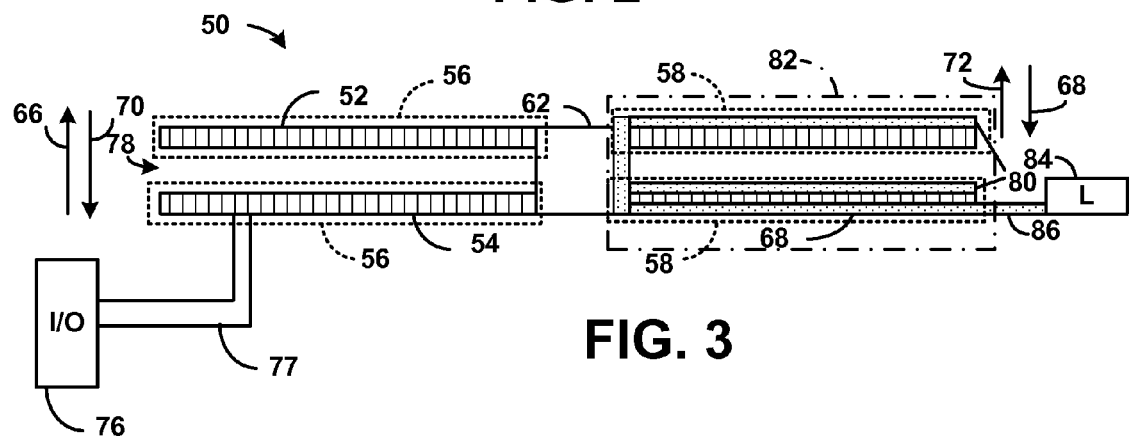
FIG. 3 illustrates a side view of the optical-microwave-quantum transducer illustrated in FIG. 2.

FIG. 2 illustrates another example of an optical-microwave-quantum transducer 50 that could be employed, for example to implement the optical-microwave-quantum transducer 4 of FIG. 1. FIG. 3 illustrates a side view of the optical-microwave-quantum transducer 50 of FIG. 2. For purposes of simplification of explanation, the same reference numbers are employed in FIGS. 2 and 3 to denote the same structure. The optical-microwave-quantum transducer 50 can include parallel nanophotonic slabs 52 and 54 that can be separated, for example, by a distance of about 10 nm. The optical-microwave-quantum transducer 50 can be housed in a refrigeration unit that can reduce the ambient temperature of the optical-microwave-quantum transducer 50 to a temperature below the critical temperature needed for superconduction (e.g., a temperature of about 10 milli-Kelvin (mK) to about 30 mK).

Each nanophotonic slab 52 and 54 can include an optical region 56 and a superconducting region 58. Each of the parallel nanophotonic slabs 52 and 54 can be formed, for example, from a material with an index of refraction of about 2, such as silicon nitride ($Si_3N_4$). Although the optical region 56 and the superconducting regions of the parallel nanophotonic slabs are illustrated as being symmetrical, in other examples, the optical region 56 and the superconducting region 58 may be asymmetrical. A first nanophotonic 52 slab of the parallel nanophotonic slabs 52 and 54 can include torsional beams 60 that are anchored to a substrate via posts 62. The torsional beams 60 can be cantilevers that extend form a body of the first nanophotonic slab 52. Moreover, the first nanophotonic slab 52 can overlay a second nanophotonic slab 54 of the parallel nanophotonic slabs 52 and 54. In some examples, the second nanophotonic slab 54 can be etched into the substrate. In other examples, the second nanophotonic slab 54 can overlay or be integrated with the substrate.

The torsional beams 60 extend along an axis 64. Moreover, the torsional beams 60 of the first nanophotonic slab 52 can allow relative movement (e.g., relative rotation) between the parallel nanophotonic slabs 52 and 54. More specifically, the torsional beams 60 can allow movement (via a torque) of the optical region 56 of the first nanophotonic slab 52 in the direction indicated by the arrow 66 that induces movement in superconducting region 58 of the first nanophotonic slab 52 in the direction indicated by the arrow 68 and vice-versa in the direction of the arrows 70 and 72 about the axis 62 (e.g., a "seesaw" motion). Thus, the first nanophotonic slab 52 can provide mechanical oscillation.

The optical region 56 of the first nanophotonic slab 52 and the second nanophotonic slab 54 can have an area of up to about 10 μm by about 10 μm. The optical region 56 of the first nanophotonic slab 52 and the second nanophotonic slab 54 can include a lattice of holes 74 that have been drilled or etched therein. Each of the holes 74 in the first and second nanophotonic slab 54 can have a radius of about 10 nm to about 100 nm. The lattice of holes 74 can be positioned to have a specific pattern, such as a hexagon pattern, as illustrated in FIG. 2. In other examples, different patterns can be employed for the lattice of holes 74.

The optical region 56 of the second nanophotonic slab 54 can be formed with a semitransparent mirror. The optical region 56 of the second nanophotonic slab 54 can receive an optical signal that can originate from an optical I/O port 76. In some examples, the optical I/O port 76 can include a transmitter, such as a laser that is transmitted along an optical channel 77 (e.g., an optical fiber). Additionally, the I/O port 76 can include a receiver such as photodiode. In some examples, optical channel 77 can be omitted. In such a situation, the I/O port 76 can be implemented as an extension of a photonic crystal, a dielectric waveguide, etc. The optical signal can have a frequency between about 100 THz and about 500 THz (e.g., about 200 THz). Some of the photons of light that is transmitted into a first surface of the optical region 56 of the second nanophotonic slab 54 can be transmitted through the second nanophotonic slab 54 and to a first surface of the optical region 56 of the first nanophotonic slab 52. The photons can become trapped between the optical regions 56 of the first and second nanophotonic slab 54s, thereby forming an optical cavity in an area indicated by the arrow 78 (e.g., a resonating cavity).

Excitation in the optical cavity 78 can cause optical pressure on the optical region 56 of the first nanophotonic slab 52. Such optical pressure can induce mechanical oscillation in the direction indicated by the arrows 66 and 68 as well as 70 and 72. During oscillation, the first nanophotonic slab 52 can move, for example, a distance of about 0.5 nm to about 2 nm. Accordingly, the optical-microwave-quantum transducer 50 can convert optical energy into mechanical energy. Equation 1 can characterize the optomechanical coupling rate between the optical cavity 78 and the first nanophotonic slab 52 (e.g., a mechanical oscillator). As Equation 1 demonstrates, the optomechanical coupling rate can be about 5 THz per nanometer (5 THz/nm).

$$G_{om} = \frac{\partial \omega_o}{\partial x} \qquad \text{Equation 1}$$

Wherein:

$G_{om}$ is the optomechanical coupling rate that characterizes the relationship of the frequency of photons in the optical cavity 78 and the linear displacement between the first nanophotonic slab 52 and the second nanophotonic slab 54;

$\omega_0$ is the frequency, in radians of the photons in the optical cavity 78; and x is the distance, in nanometers, of the linear displacement of the first nanophotonic slab 52 relative to the second nanophotonic slab 54.

The superconducting region 58 of the parallel nanophotonic slabs 52 and 54 can be coated with a layer (e.g., a plate) of superconducting material 80, such as superconducting aluminum or other superconducting material 80. Each layer of superconducting material 80 on the superconducting region 58 of the parallel nanophotonic slabs 52 and 54 can form plates of a vacuum gap capacitor 82. The capacitance of the vacuum gap capacitor 82 can be defined by Equation 2.

$$C = \varepsilon_0 \frac{A}{d} \qquad \text{Equation 2}$$

Wherein:

C is the capacitance of the vacuum gap capacitor 82;

$\varepsilon_0$ is the permittivity of free space;

d is the distance between the first plate and the second plate of the vacuum gap capacitor 82; and A is the area of the first plate of the vacuum gap capacitor 82.

The area of the first plate of the vacuum gap capacitor 82 can be about 10 μm² (e.g., about 2-5 μm×about 2-5 μm) to about 100 μm² (e.g., about 10 μm×about 10 μm) or more. The vacuum gap capacitor 82 can be coupled in parallel to an inductor 84 via conductive traces 86 that can be etched on the substrate and the parallel nanophotonic slabs 52 and 54. The inductor 84 can be implemented, for example, as a low capacitance inductive element. In some examples, one of the conductive traces 86 can be etched along a torsional beam 60. The inductor can be, for example, a square spiral inductor.

The vacuum gap capacitor 82 and the inductor 84 can form a superconducting cavity, which can be a superconducting LC circuit (e.g., an LC resonator) that can resonate at frequencies of about 10 MHz to about 1 GHz. For example, if the LC circuit has a resonant frequency of about 10-100 MHz, the first plate of the vacuum gap capacitor 82 can have a side length and width on the order of about 10-100 micrometers. Additionally, if the LC circuit has a resonant frequency of about 1 GHz, the first plate of the vacuum gap capacitor 82 can have a side length and width on the order of about 2-3 micrometers.

Oscillation of the first nanophotonic slab 52 relative to the second nanophotonic slab 54 induces electrical modulation (e.g., a charge) on the plates of the vacuum gap capacitor 82, which electrical modulation induces a current in the superconducting LC circuit. Accordingly the optical-microwave-quantum transducer 50 can convert mechanical energy into electrical energy.

Equation 3 can characterize the electromechanical coupling rate between the mechanical oscillator and the superconducting cavity. As Equation 3 demonstrates, the electromechanical coupling rate can be about 100 MHz per nanometer (100 MHz/nm).

$$G_{em} = \frac{\partial \omega_e}{\partial x} \qquad \text{Equation 1}$$

Wherein:

$G_{em}$ is the electromechanical coupling rate that characterizes the relationship of the frequency of electrical modulation in the superconducting cavity (e.g., the frequency of the current in the LC circuit) and the linear displacement between the first nanophotonic slab 52 and the second nanophotonic slab 54;

$\omega_e$ is the frequency, in radians, of the electrical modulation of the superconducting cavity (e.g., the frequency of the current in the LC circuit); and x is the distance, in nanometers, of the linear displacement of the first nanophotonic slab 52 relative to the second nanophotonic slab 54.

The torsional frequency of the optical-microwave-quantum transducer 50 can be calculated with Equations 4-6.

$$\Omega_m = \sqrt{\frac{\kappa}{I_p}} \qquad \text{Equation 4}$$

wherein:

$\Omega_m$ is the torsional frequency of the optical-microwave-quantum transducer 50;

$\kappa$ is the torsional spring constant of the first nanophotonic slab 52 (paddle oscillator); and $I_p$ is the total moment of inertia of the first nanophotonic slab 52 (the paddle oscillator).

The spring constant, $\kappa$ can be calculated with Equation 5:

$$\kappa = \frac{2\mu h_r w_r^3}{l_r}\left[\frac{1}{3} - 0.21\frac{w_r}{h_r}\left(1 - \frac{h_r^4}{12 w_r^4}\right)\right] \qquad \text{Equation 5}$$

wherein:

$l_r$ is the length of each torsional beam 60;

$h_r$ and $w_r$ are the cross sectional dimensions of each torsional beam 60, wherein $h_r > w_r$; and $\mu$ is characterized by Equation 6.

$$\mu = \frac{Y}{2(1+\nu)} \qquad \text{Equation 6}$$

wherein:

Y is Young's modulus of the material employed to form the first nanophotonic slab 52 (about 100-250 GPa for $Si_3N_4$); and $\nu$ is Poisson ratio of the material employed to form the first nanophotonic slab 52 (about 0.22-0.27 for $Si_3N_4$).

In reverse, electrical modulation (e.g., a current) at the superconducting cavity can induce movement (e.g., relative rotation) of the superconducting region 58 of the first nanophotonic slab 52 relative to the second nanophotonic slab 54 in the direction of the arrows 72 and 68. Such movement can cause a corresponding movement of the optical region 56 of the first nanophotonic slab 52 in the directions indicated by the arrows 70 and 66. The movement can induce optical photons (e.g., excitation) in the optical cavity 78 between the optical regions 56 of the parallel nanophotonic slabs 52 and 54. Excitation in the optical cavity 78 can cause light photons to be transmitted through the first surface of the second nanophotonic slab 54 and into the optical channel 77, which can induce an optical signal on the optical channel 77. The optical signal can be received, for example, at the optical I/O port 76. In other examples, the optical I/O port 76 can be implemented on a second optical-microwave-quantum transducer that can be separated by a relatively large distance over the optical channel 77.

In some examples, the optical-microwave-quantum transducer 50 facilitates quantum state transfer. Specifically, the transduction system allows for mapping of the quantum state in the optical channel 77 (an optical mode) on to the superconducting cavity (an electrical mode) or vice versa. Such a quantum state transfer allows for communication between the two different modes. Additionally or alternatively, the optical-microwave-quantum transducer 50 system allows iterate photon transfer, which provides for scattering in the optical mode to be mirrored in the electrical mode, or vice versa.

Moreover, since the first nanophotonic slab 52 of the optical-microwave-quantum transducer 50 is only anchored to the substrate at two points, namely at the torsional beams 60, the optical-microwave-quantum transducer 50 has a relatively low clamping loss. Additionally, since the first plate and the second plate of the vacuum gap capacitor 82 can be relatively large, a relatively large capacitance can be achieved, which can correspond to a large electromechanical coupling. Furthermore, as illustrated, the vacuum gap capacitor 82 and the inductor of the LC superconducting circuit can be spatially separated. Such a spatial separation allows for a relatively large participation ratio and a high cooperativity to further increase the electromechanical coupling rate. Further still, the high participation ratio can make the optical-microwave-quantum transducer 50 less susceptible to quasiparticle noise.

The components of the optical-microwave quantum transducer 50 can be fabricated on a common IC chip. That is, both optical components and electrical components can be integrated on the same IC chip. Moreover, such an IC chip can be fabricated by employing modern fabrication techniques and without the need for external alignment.

FIG. 3 illustrates a three dimensional view of another example of an optical-microwave-quantum transducer 100. The optical-microwave-quantum transducer 100 can be employed to implement the optical-microwave-quantum transducer 4 and/or 50 illustrated in FIGS. 1 and 2.

The optical-microwave-quantum transducer 100 can include two parallel nanophotonic slabs 102 and 104 that could be employed to implement the parallel nanophotonic slabs 52 and 54 illustrated in FIG. 2. The optical-microwave-quantum transducer 100 can be stored in a refrigeration unit at temperatures below the critical temperature needed for superconduction (e.g., between about 10 mK and about 30 mK).

A first nanophotonic slab 102 of the parallel nanophotonic slabs 102 and 104 can overlay a second nanophotonic slab 104 of the parallel nanophotonic slabs 102 and 104. Each of the parallel nanophotonic slabs 102 and 104 can be implemented, for example with silicon nitride ($Si_3N_4$) or similar material. In some examples, the second nanophotonic slab 104 can be etched into a substrate. Each of the parallel nanophotonic slabs 102 and 104 can have an optical region 106 and a superconducting region 108. Although FIG. 3 illustrates the optical region 106 and the superconducting region 108 as being symmetrical in size, in other examples, the optical region 106 and the superconducting region 108 can be asymmetrical.

The first nanophotonic slab 102 can include two torsional beams 105 that can be anchored to the substrate via posts. The torsional beams 105 can be formed as cantilevers that extend perpendicularly from a body of the first nanophotonic slab 102. Accordingly, the first nanophotonic slab 102 can partially rotate about an axis 107 to provide relative movement between the first nanophotonic slab 102 and the second nanophotonic slab 104, in a manner described herein. Accordingly, the first nanophotonic slab can partially rotate (e.g., twist) in the direction indicated by the arrows 109.

The optical region 106 of the parallel nanophotonic slabs 102 and 104 can each include a lattice of holes 110 (e.g., an array of holes). In the present example, the lattice of holes 110 has a hexagonal shape. In other examples, other shapes for the lattice could be employed.

The superconducting region 108 of the parallel nanophotonic slabs 102 and 104 can have a layer of superconducting material 110 disposed thereon, such as superconducting aluminum. The superconducting material 110 disposed on the first nanophotonic slab 102 can be a first plate of a vacuum gap capacitor 112 and the superconducting material 110 disposed on the second nanophotonic slab 104 can be a second plate of the vacuum gap capacitor 112. The capacitance of the vacuum gap capacitor 112 can be calculated from Equation 2. The first plate of the vacuum gap capacitor 112 can be conductively coupled to a first terminal 114 of an inductor 116, and the second plate of the vacuum gap capacitor 112 can be conductively coupled to a second terminal 118 of the inductor 116 such that the vacuum gap capacitor 112 and the inductor 116 are connected in parallel. The vacuum gap capacitor 112 and the inductor 116 can form an LC superconducting circuit (the superconducting cavity).

In some examples, the inductor 116 can have a square spiral shape. Moreover, in the present example, the inductor 116 is center-tapped and conductively coupled to the first plate of the vacuum gap capacitor 112. In other examples, different configurations of the inductor 116 can be employed.

An optical signal (e.g., an optical signal) can be transmitted into the optical region 106 of the second nanophotonic slab 104 in a direction indicated by the arrow 120. Photons of the optical signal can be transmitted through the second nanophotonic slab 104 to the first nanophotonic slab 102, wherein an optical cavity can be formed. Excitation in the optical cavity can apply an optical pressure to the first nanophotonic slab 102 that can cause the first nanophotonic slab 102 to oscillate in the manner described herein. Accordingly, the optical-microwave-quantum transducer 100 can convert optical energy into mechanical energy. The optomechanical coupling rate of the optical-microwave-quantum transducer 100 can be calculated by employing Equation 1.

The oscillation of the first nanophotonic slab 102 can induce electrical modulation in the superconducting cavity. That is, the oscillation of the first nanophotonic slab 102 can induce a charge on the vacuum gap capacitor 112, which in turn can induce a current on the superconducting LC circuit. In this manner, the optical-microwave-quantum transducer 100 can convert mechanical energy into electrical energy. The electromechanical coupling rate for the optical-microwave-quantum transducer 100 can be determined from Equation 3. The torsional frequency of the optical-microwave-quantum transducer 100 can be calculated by employing Equations 4-6. In FIG. 3 the length of the torsional beam is labeled as "l", the width of the torsional beam is labeled as "w" and the height of the torsional beam is labeled as "h".

In reverse, an electrical current at the superconducting LC circuit can cause the first nanophotonic slab 102 to oscillate, thereby converting electrical energy into mechanical energy. Correspondingly, the oscillation of the first nanophotonic slab 102 can induce photons (e.g., excitation) in the optical cavity of the optical-microwave-quantum transducer 100. Such induction of photons can generate an optical signal that can be transmitted through the second nanophotonic slab 104 to the optical channel.

The optical-microwave-quantum transducer 100 can facilitate quantum state transfer. Specifically, the optical-microwave-quantum transducer 100 system allows for mapping of the quantum state in an optical mode (corresponding to the optical signal) on to the superconducting cavity (an electrical mode) or vice versa. Such a quantum state transfer allows for communication between the two different modes. Additionally or alternatively, the optical-microwave-quantum transducer 100 system allows iterate photon transfer, which provides for scattering in the optical mode to be mirrored in the electrical mode, or vice versa.

Moreover, since the first nanophotonic slab 102 of the optical-microwave-quantum transducer 100 is only anchored to the substrate at two points, namely at the torsional beams, the optical-microwave-quantum transducer 100 has a relatively low clamping loss. Additionally, since the first plate and the second plate of the vacuum gap capacitor 112 can be relatively large, a relatively large capacitance can be achieved, which can correspond to a large electromechanical coupling. Furthermore, as illustrated, the vacuum gap capacitor 112 and the inductor 116 of the LC superconducting circuit can be spatially separated. Such a spatial separation allows for a relative large participation ratio and a high cooperativity to further increase the electromechanical coupling rate. Further still, the high participation ratio can make the optical-microwave-quantum transducer 100 less susceptible to quasiparticle noise.

Figure 4:
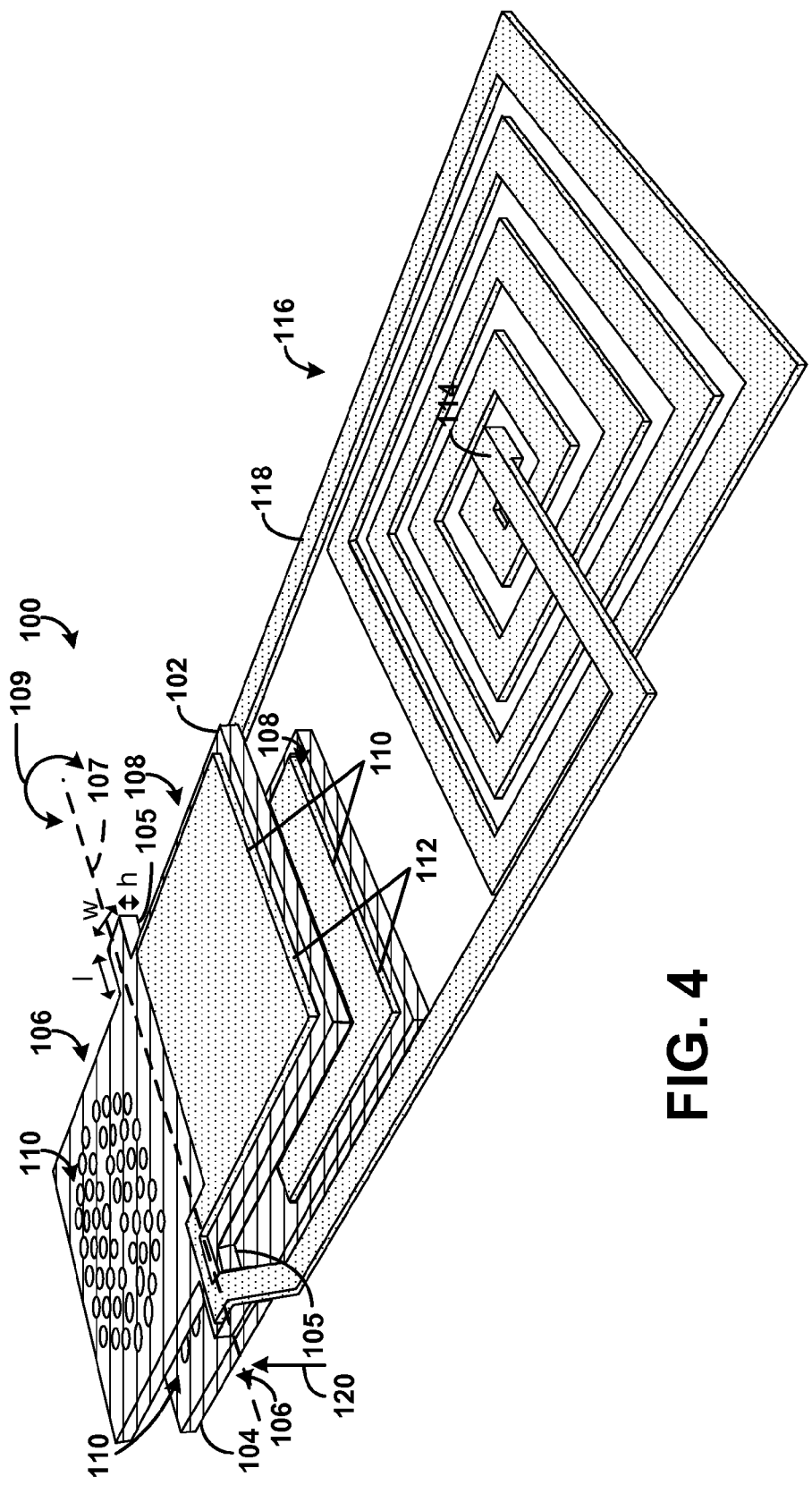
FIG. 4 illustrates an example of a three-dimensional view of an optical-microwave-quantum transducer.
Figure 5:
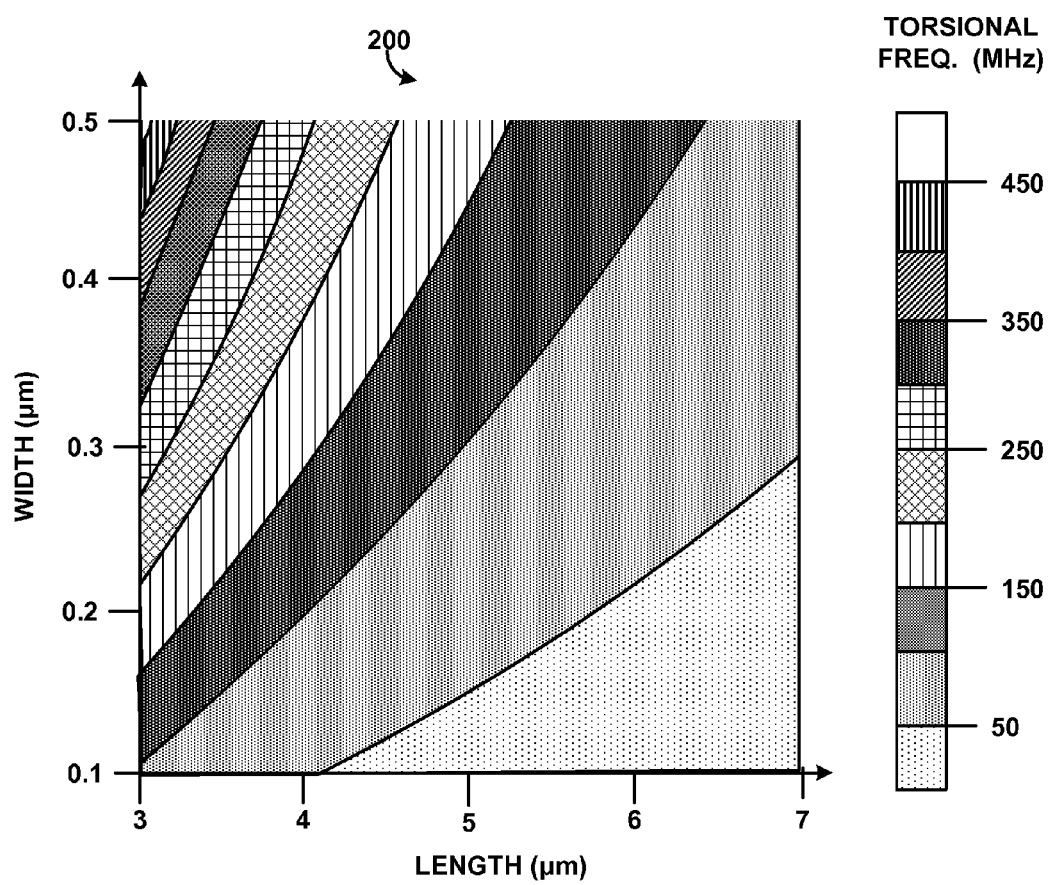
FIG. 5 illustrates a graph that plots a torsional frequency as a function of a length and width of a torsional beam.

FIG. 5 illustrates a graph 200 that plots torsional frequency, $\Omega_m$, (in MHz) (e.g., oscillation frequency) of an optical-microwave-quantum transducer (e.g., the optical-microwave-quantum transducer 4, 50 and/or 100 illustrated in FIGS. 1-4) as a function of the length and width (in μm) of each torsional beam of a nanophotonic slab, such as the first nanophotonic slab 52 illustrated in FIG. 2 and/or the first nanophotonic slab 102 illustrated in FIG. 4. As is illustrated, increasing the length and/or the width of each torsional beam increases the torsional frequency. In many operations, a desired the torsional frequency would be between 100 MHz and about 1 GHz. As illustrated, by employing an optical-microwave-quantum transducer, as described herein, such a desired range of torsional frequencies can be achieved.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. An optical-microwave-quantum transducer comprising:
   a first nanophotonic slab and a second nanophotonic slab,
      wherein each of the first and second nanophotonic slabs includes an optical region and a superconducting region;
   the first nanophotonic slab further comprising a pair of torsional beams anchored to a substrate to facilitate relative rotation between the first and second nanophotonic slabs about an axis of rotation;
   wherein a gap between the optical region of the first and second nanophotonic slabs forms an optical cavity in response to an optical signal, wherein the optical cavity induces mechanical oscillation of the first nanophotonic slab about the axis of rotation; and
   wherein the mechanical oscillation induces electrical modulation on a superconducting cavity coupled to the superconducting regions of the first and second nanophotonic slabs.

2. The optical-microwave-quantum transducer of claim 1, wherein electrical modulation on the superconducting cavity induces mechanical oscillation of the first nanophotonic slab about the axis of rotation, wherein the mechanical oscillation induces excitation in the optical cavity.

3. The optical-microwave-quantum transducer of claim 2, wherein the excitation induced in the optical cavity induces an optical signal on an optical channel.

4. The optical-microwave-quantum transducer of claim 2, wherein the superconducting cavity is a superconducting LC circuit.

5. The optical-microwave-quantum transducer of claim 4, wherein a capacitor of the superconducting LC circuit comprises a first plate of superconducting material overlaying the first nanophotonic slab and a second plate of superconducting material overlaying the second nanophotonic slab.

6. The optical-microwave-quantum transducer of claim 4, wherein an inductor of the superconducting LC is conductively coupled to the capacitor and is spatially separated from the capacitor.

7. The optical-microwave-quantum transducer of claim 6, wherein the inductor is a spiral inductor.

8. The optical-microwave-quantum transducer of claim 7, wherein the inductor is centered-tapped by a trace coupled to the first plate of the capacitor.

9. The optical-microwave-quantum transducer of claim 2, wherein the optical region of the second nanophotonic slab is coupled to an optical channel.

10. The optical-microwave-quantum transducer of claim 2, wherein the optical region of the first and second nanophotonic slabs comprises a lattice of holes disposed therein.

11. The optical-microwave-quantum transducer of claim 10, wherein the lattice of holes of the first and second nanophotonic slabs each have a hexagonal shape.

12. The optical-microwave-quantum transducer of claim 1, wherein the optical-microwave-quantum transducer has an optomechanical coupling rate characterized by:

$$G_{om} = \frac{\partial \omega_o}{\partial x}$$

wherein:
   $G_{om}$ is the optomechanical coupling rate that characterizes the relationship of the frequency of photons in the optical cavity and the linear displacement between the first nanophotonic slab and the second nanophotonic slab;
   $\omega_0$ is the frequency, in radians of the photons in the optical cavity; and
   x is the distance, in nanometers, of the linear displacement of the first nanophotonic slab relative to the second nanophotonic slab.

13. The optical-microwave-quantum transducer of claim 1, wherein the optical-microwave-quantum transducer has an optomechanical coupling rate characterized by:

$$G_{em} = \frac{\partial \omega_e}{\partial x}$$

wherein:
   $G_{em}$ is the electromechanical coupling rate that characterizes the relationship of the frequency of electrical modulation in the superconducting cavity and linear displacement between the first nanophotonic slab and the second nanophotonic slab;
   $\omega_e$ is the frequency, in radians, of the modulation in the superconducting cavity; and
   x is the distance, in nanometers, of the linear displacement of the first nanophotonic slab relative to the second nanophotonic slab.

14. The optical-microwave-quantum transducer of claim 1, wherein the optical-microwave-quantum transducer has a torsional frequency characterized by:

$$\Omega_m = \sqrt{\frac{\kappa}{I_p}}$$

wherein:
   $\Omega_m$ is the torsional frequency of the optical-microwave-quantum transducer;
   $\kappa$ is the torsional spring constant of the first nanophotonic slab; and
   $I_p$ is the total moment of inertia of the first nanophotonic slab.

15. The optical-microwave-quantum transducer of claim 14, wherein the torsional spring constant of the first nanophotonic slab is characterized by:

$$\kappa = \frac{2\mu h_r w_r^3}{l_r}\left[\frac{1}{3} - 0.21\frac{w_r}{h_r}\left(1 - \frac{h_r^4}{12w_r^4}\right)\right]$$

wherein:
- $l_r$ is the length of a given torsional beam of the pair of torsional beams;
- $h_r$ and $w_r$ are the cross sectional dimensions of the given torsional beam, wherein $h_r > w_r$; and
- $\mu$ is characterized by:

$$\mu = \frac{Y}{2(1+v)}$$

wherein:
- Y is Young's modulus of the material employed to form the first nanophotonic slab; and
- v is Poisson ratio of the material employed to form the first nanophotonic slab.

16. An integrated circuit (IC) chip comprising the optical-microwave-quantum transducer of claim 1.

17. An optical-microwave-quantum transducer comprising:
a nanophotonic slab that is electrically coupled to a superconducting cavity and that is optically coupled to an optical cavity, the nanophotonic slab being configured to mechanically oscillate about an axis of rotation in response to either excitation in the optical cavity or electrical modulation in the superconducting cavity;
wherein mechanical oscillation induced by excitation induces electrical modulation in the superconducting cavity; and
wherein mechanical oscillation induced by electrical modulation induces excitation in the optical cavity.

18. The optical-microwave-quantum transducer of claim 17, wherein the excitation in the optical cavity induces an optical signal on an optical channel.

19. The optical-microwave-quantum transducer of claim 17, wherein the nanophotonic slab has a superconducting region with superconducting material overlaid thereon, wherein the superconducting material forms a first plate of a vacuum gap capacitor of the superconducting cavity, wherein the first plate overlays a second plate of the vacuum gap capacitor.

20. A system comprising:
a refrigeration unit that stores an optical-microwave-quantum transducer at superconducting temperatures, the optical-microwave-quantum transducer comprising:
a nanophotonic slab that is electrically coupled to a superconducting cavity and that is optically coupled to an optical cavity, the nanophotonic slab being configured to mechanically oscillate about an axis of rotation in response to either excitation in the optical cavity or electrical modulation in the superconducting cavity;
wherein the optical cavity is optically coupled to an optical channel;
wherein the superconducting cavity comprises a vacuum gap capacitor and an inductor that are spatially separated, wherein a plate of the vacuum gap capacitor is formed on the nanophotonic slab; and
a node configured to transmit and receive optical signals on the optical channel comprising an optical fiber, wherein the node is external to the refrigeration unit.

21. The system of claim 20, wherein the node comprises another refrigeration unit that stores another optical-quantum transducer at superconducting temperatures.

* * * * *